United States Patent [19]
Palara

[11] Patent Number: 5,027,004
[45] Date of Patent: Jun. 25, 1991

[54] CIRCUIT FOR REGULATING THE BASE CURRENT OF A SEMICONDUCTOR POWER DEVICE

[75] Inventor: Sergio Palara, Acicastello, Italy

[73] Assignee: SGS-Thomson Microelectronics s.r.l., Agrate Brianza, Italy

[21] Appl. No.: 480,047

[22] Filed: Feb. 14, 1990

[30] Foreign Application Priority Data

Feb. 21, 1989 [IT] Italy .............................. 19502 A/89

[51] Int. Cl.⁵ ........................... H03K 3/01; H03K 3/26
[52] U.S. Cl. ................................. 307/270; 307/296.6; 307/356; 307/315; 323/315
[58] Field of Search ............... 323/315, 316, 280, 281, 323/312; 307/356, 353, 270, 288, 296.7, 296.6, 315

[56] References Cited

U.S. PATENT DOCUMENTS

| | | | |
|---|---|---|---|
| 4,638,239 | 1/1987 | Hachimori | 323/281 |
| 4,703,249 | 10/1987 | De La Plaza et al. | 323/281 |
| 4,814,724 | 3/1989 | Tanigawa | 323/315 |
| 4,879,524 | 11/1989 | Bell | 323/315 |
| 4,950,976 | 8/1990 | Wagoner | 323/315 |

Primary Examiner—Stanley D. Miller
Assistant Examiner—Toan Tran
Attorney, Agent, or Firm—Sixbey, Friedman, Leedom & Ferguson

[57] ABSTRACT

A circuit for regulating the base current of a semiconductor power device is accomplished with a first amplifier which measures the difference in potential across a first detection resistance which is passed through by a base current, with a second amplifier, which measures the voltage across a second detection resistance passed through by the emitter current of the power device, and with a means sensitive to the difference between a current, present at the output of the first amplifier, and a current present at the output of the second amplifier.

Said sensitive means, acting on a variable current generator, maintains currents $I_1$ and $I_2$ equal to one another, and thus maintains constant the ratio between the emitter current of the powder device and the base current of the same.

13 Claims, 3 Drawing Sheets

CIRCUIT FOR REGULATING THE BASE CURRENT OF A SEMICONDUCTOR POWER DEVICE

The present invention relates to a circuit regulating the base current of a semiconductor power device.

In the driving systems wherein the collector current of a power device has a ramp-type trend as opposed to a step type trend, the base current may be supplied to such a device with a step trend. This is the simplest system, and is commonly used in driving motors, in electronic ignition, and in general in all systems wherein the power device has an inductance as a collector load.

In the driving systems currently in use, the base current has a step-type trend, and thus reaches the maximum value instantly, while the collector current takes a certain time interval to reach its maximum value.

This obviously constitutes an unnecessary overdriving of the power device, which involves a dissipation of energy on the generator of the base current.

The object of the present invention is to accomplish a circuit for regulating the base current of a semiconductor power device which limits the dissipated power.

According to the invention such object is attained with a regulating circuit comprising a base current generator for the power device, characterized in that it has a first amplifier driven by said base current, a second amplifier driven by the emitter current of said power device and a means sensitive to the difference between an output current of said first amplifier and an output current of said second amplifier, such sensitive means acting on said generator so as to regulate said base current to a value such as to maintain said output currents equal to one another and thus to maintain constant the ratio between the emitter current of the device and said base current.

Preferably the circuit according to the invention provides for the value of the ratio between said emitter and base currents to be equal to the minimum gain of the power device.

In this way there is accomplished a circuit such that the trend of the power device's base current is no longer of the step type, which diminishes the dissipation of power on the current generator; for example, in the case of a waveform of the collector current of the device having a saw-tooth shape, the total dissipated power on the current generator is equal to half that dissipated in the case of a constant base current during one cycle.

A preferred and particularly suitable application of the regulating circuit according to the invention is connected with the utilization of a Darlington power device, since in that case the regulating circuit operates with a voltage equal to the sum of the base-emitter voltages of the power device.

An application of the circuit is possible to a power device formed by a single transistor, even though this second application implies larger problems, since the power supply voltage of the regulating circuit is insufficient, since such voltage is equal to the voltage between base and emitter of the power device itself.

The characteristics of the present invention shall be explained with greater clarity in the following detailed description of some of its preferred embodiments, illustrated as non-limiting examples, in the following drawings, wherein.

Figure 1:
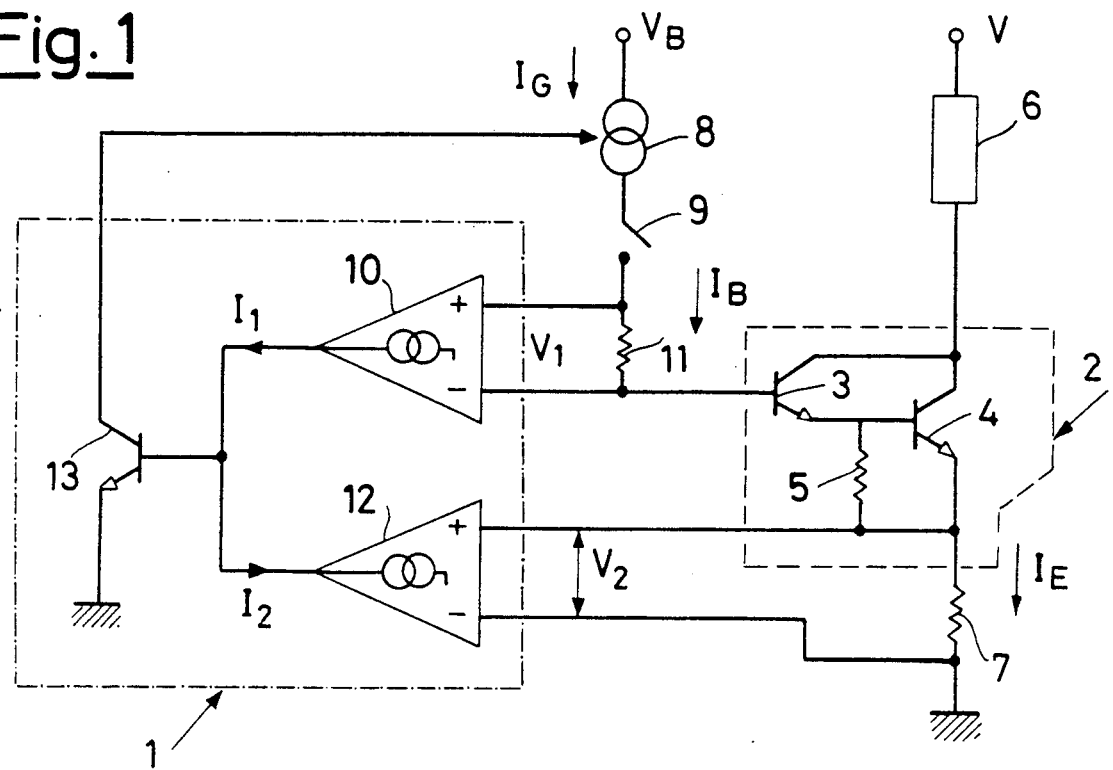
FIG. 1 shows a diagram of the regulating circuit according to the invention, wherein the power element is constituted by a bipolar Darlington device.

With reference to the drawings, FIG. 1 shows a regulating circuit 1, applied to a Darlington power device 2, constituted by a first transistor 3, by a second transistor 4 and by a resistance 5; such Darlington device is supplied with a voltage V and is connected in series with an ohmic-inductive load 6 and a low-value detection resistance 7, through which passes an emitter current $I_E$ of the power device.

There is present in the diagram a variable current generator 8, which generates a base current $I_B$ and absorbs a current $I_G$. The generator is supplied by a voltage $V_B$, and is in series with a detection resistance 11, which connects it to transistor 3, and with a switch 9.

The regulating circuit 1 comprises a first transconductance amplifier 10, which supplies at output a source current $I_1$, dependent on a voltage $V_1$, taken across resistance 11, a second amplifier 12, which absorbs a sink current $I_2$, dependent on a voltage $V_2$, taken across resistance 7, and a regulating transistor 13, suitable for regulating the base current $I_B$, acting on generator 8. The base of said transistor 13 is connected to the outputs of amplifiers 10 and 12, the emitter is connected to ground and the collector is connected to generator 8.

Figure 2:
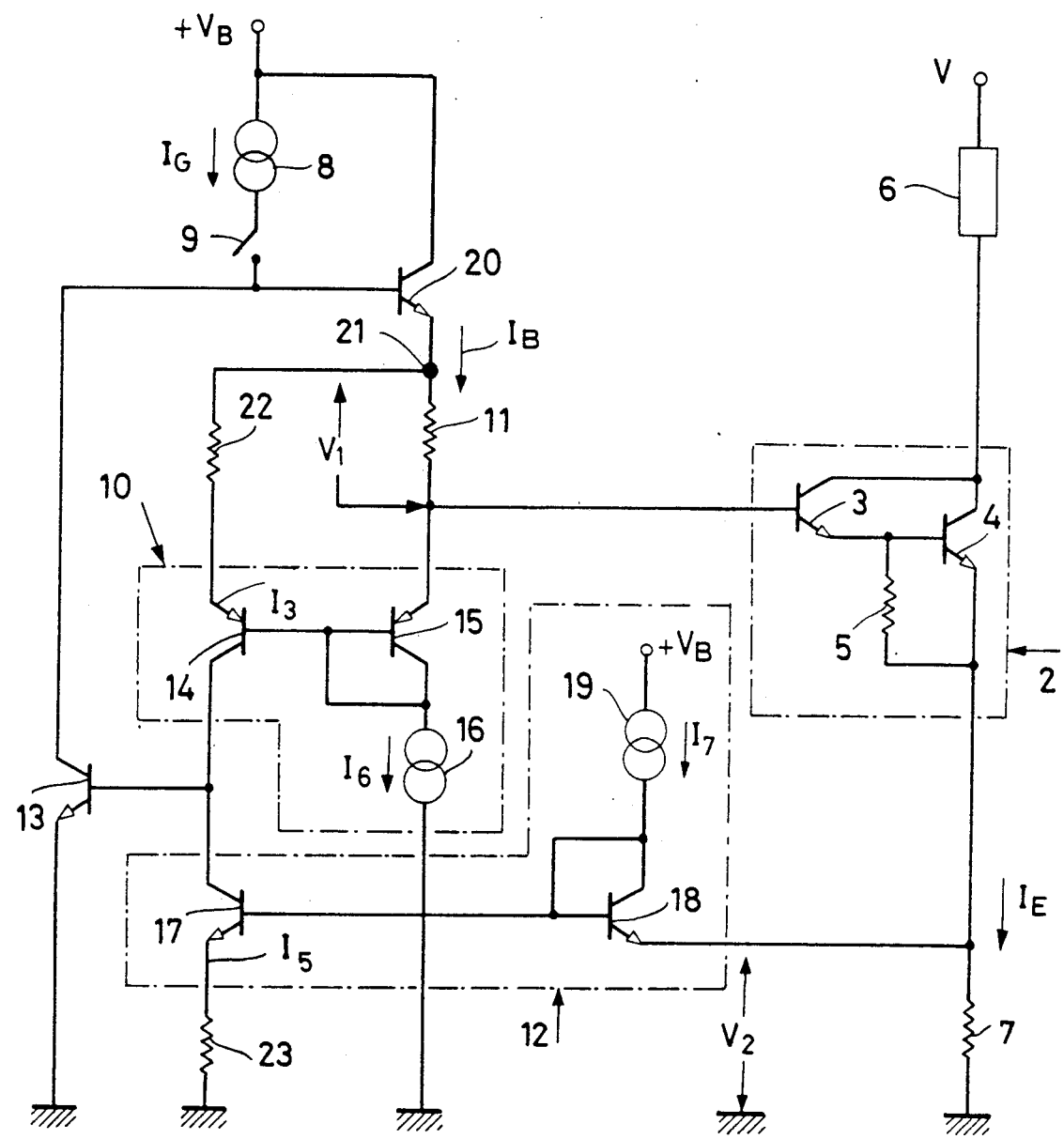
FIG. 2 shows the same diagram of FIG. 1, highlighting the components of the regulating circuit itself.

An example of an embodiment of the regulating circuit is shown in FIG. 2, wherein it is seen that the transconductance amplifier 10 is constituted by a first transistor 14, by a second transistor 15 and by a current generator 16 supplied with a current $I_6$; the amplifier 12 is constituted by a first transistor 17, by a second transistor 18, and by a current generator 19, supplied with a current $I_7$.

With reference to the specific example of FIG. 2, the operating mode of the circuit of FIG. 1 is the following: when switch 9 is closed, transistor 20 is activated, being supplied by voltage $V_B$, which supplies current to the base of the Darlington device 2 through detection resistance 11.

Transistors 17 and 18, current mirror connected, driven by generator 19, maintain transistor 17 on, which keeps transistor 13 off.

When the voltage at the point 21 reaches a value equal to the sum of the base-emitter voltage of transistor 15 and of the saturation voltage of generator 16, that is, approximately when Darlington device 2 is turned on, then transistors 14 and 15, current mirror connected, driven by generator 16, are enabled for conduction.

Amplifier 12 measures the voltage $V_2$ across detection resistance 7, and thus measures the emitter current $I_E$, equal to the ratio between voltage $V_2$ and resistance 7; the output current $I_2$ of amplifier 12 thus depends on current $I_E$.

Amplifier 10 measures the voltage difference $V_1$ across resistance 11; the output current $I_1$ of said amplifier 10 thus depends on current $I_B$, since said voltage $V_1$ is equal to the product of resistance 11 by current $I_B$.

The condition of equilibrium of the regulating circuit 1 is obtained when voltage $V_1$ is equal to voltage $V_2$; in this case, if amplifiers 10 and 12 have the same transconductance gain, the circuit forces the values of current $I_1$ and current $I_2$ (FIG. 1) to be equal.

Since the value of voltage $V_1$ is equal to the value of voltage $V_2$, the product of resistance 11 by current $I_B$ and the product of resistance 7 by current $I_E$ are equal to one another; the ratio between said currents $I_E$ and $I_B$, and the ratio between resistance 11 and resistance 7 are thus constant, and equal to the constant value dependent on the minimum transconductance gain $h_{FEmin}$ of power device 2.

If said ratio tends to fall, that is, if there exists an overdriving of Darlington device 2, it means that voltage $V_1$ is higher than voltage $V_2$, and thus current $I_1$ has a value which is higher than $I_2$. The difference between the value of current $I_1$ and the value of current $I_2$ activates control transistor 13, which reduces the current of generator 8, and restores equilibrium.

If current $I_B$ of Darlington device 2 is underdriven, it means that the value of voltage $V_2$ is higher than the value of $V_1$, and thus the value of current $I_2$ is higher than current $I_1$; this difference between the values of currents $I_1$ and $I_2$ causes transistor 13 to be turned off, which will no longer control current generator 8, allowing an increase in current $I_G$ and thus of current $I_B$, again restoring equilibrium.

A resistance 22, connected between transistor 20 and transistor 14, is useful for regulating the excursion of a current $I_3$, absorbed by transistor 14; a resistance 23, connected between transistor 17 and ground, regulates the excursion of a current $I_5$, delivered by transistor 17.

Figure 3:
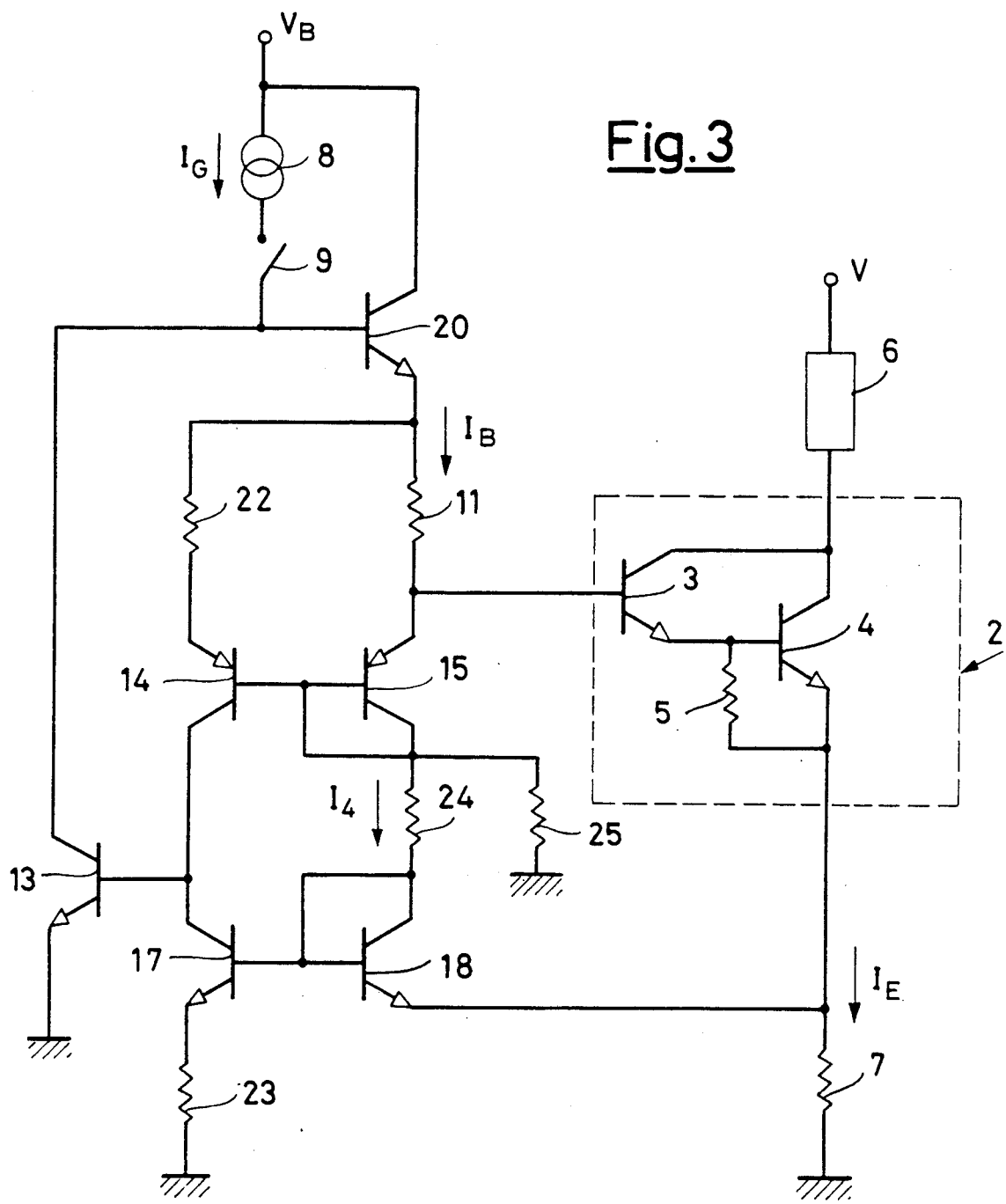
FIG. 3 shows the detailed diagram of the circuit according to the invention in a further possible embodiment.

Another embodiment of the regulating circuit according to the invention is presented in FIG. 3; a resistance 24 is connected between the current mirror formed by transistors 14 and 15 and the current mirror formed by transistors 17 and 18. In this way transistor 15 and transistor 18 are passed through by a same current $I_4$.

A further improvement in the performance is obtained by introducing a resistance 25, connected between ground and said current mirrors; said resistance 25 minimizes the base current $I_B$ when the power device is turned on, that is when switch 9 is closed.

The influence of resistance 25 manifests itself at the instant when switch 9 is closed, since the current mirror formed by transistors 14 and 15 becomes activate before power device 2 is turned on. In fact, while the Darlington device 2 is turned on when there is a voltage at its base equal to twice the voltage between base and emitter, the current mirror formed by transistors 14 and 15 is activated with a voltage across it equal to the value of the voltage between base and emitter. This allows transistor 14 to supply current immediately to transistor 13, which immediately regulates current generator 8.

In this way there is a proportional law obtained between the emitter current $I_E$ and the base current $I_B$ beginning at the initial instant, further reducing the dissipation of power.

Figure 4:
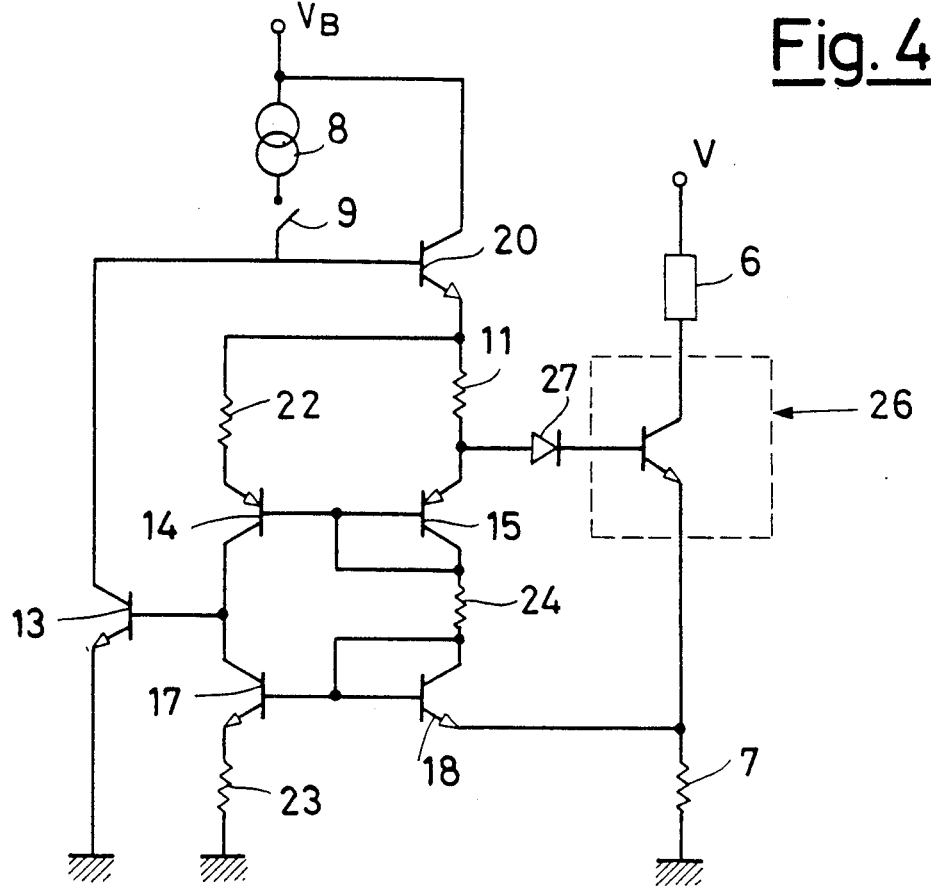
FIG. 4 shows the diagram of the regulating circuit when the power device is constituted by a single transistor.

In FIG. 4 the regulator according to the invention is applied to a single transistor 26; in this case it is necessary to connect a diode 27 between transistor 26 and the current mirror formed by transistors 14 and 15, to obtain a sufficient supply voltage of the control circuit.

The circuit according to the invention presented in the figures, is very well suited for integration. This allows a good coupling between amplifier 10 and amplifier 12. Integration also allows a good coupling between resistance 7 and resistance 11, because these two resistances can be accomplished by means of metallic tracks of appropriate size.

By accomplishing these metallic tracks with the same material, say aluminium, an excellent thermal coupling is also obtained, since they are at the same temperature. This is essential for the accuracy of regulation, as it is known that the resistivity of aluminium has an appreciable temperature drift.

I claim:

1. A regulating circuit, comprising a current generator for generating a base current for a power device also having an emitter current, a first amplifier driven by said base current and having an output producing an output current, a second amplifier driven by the emitter current of said power device and having an output producing an output current, and a sensing means connected to an output of the first amplifier, an output of the second amplifier, and the current generator, said sensing means being sensitive to the difference between the output current of said first amplifier and the output current of said second amplifier, said sensing means controlling said current generator so as to regulate said base current to maintain said output currents of the first and second amplifiers equal to one another, and thus to maintain constant ratio between the emitter current of the power device and said base current.

2. Regulating circuit according to claim 1, characterized in that base current is regulated so that the value of the ratio between emitter and base currents are equal to the minimum gain of the device.

3. Regulating circuit according to claim 1, characterized in that said power device is a Darlington device.

4. Regulating circuit according to claim 1, characterized in that the power device is a bipolar transistor, which includes a diode in its base circuit.

5. Regulating circuit according to claims 1, or 3, or 4, characterized in that the first and second amplifiers are transconductance amplifiers.

6. Regulating circuit according to claim 5, characterized in that said transconductance amplifiers each comprise a pair of transistors connected in a current mirror circuit.

7. Regulating circuit according to claim 6, characterized in that the current mirrors of said amplifiers are supplied in an independent manner by respective current generators.

8. Regulating circuit according to claim 6, characterized in that the current mirrors of said amplifiers are supplied by a single current generator constituted by a resistance connected between said mirrors.

9. Regulating circuit according to claim 8, characterized in that it comprises a further resistance connected between said current mirrors and ground for regulating the base current at the instant when the power device is turned on.

10. Regulating circuit according to claims 1, or 3, or 4, characterized in that it comprises two detection resistances connected in series with said power device and with said current generator, respectively, to supply said amplifiers with respective voltages proportional to said base current and said emitter current.

11. A regulating circuit, comprising a current generator for generating a base current for a power device also having an emitter current, a first amplifier driven by said base current and having an output producing an output current, a second amplifier driven by the emitter current of said power device and having an output producing an output current, and a sensing means connected to an output of the first amplifier, an output of the second amplifier, and the current generator, said sensing means being sensitive to the difference between the output current of said first amplifier and the output current of said second amplifier, said sensing means controlling said current generator so as to regulate said base current to maintain said output currents of the first and second amplifiers equal to one another, and thus to maintain constant the ratio between the emitter current of the power device and said base current characterized in that it is accomplished in an integrated form.

12. Regulating circuit according to claim 11, wherein two detection resistances are connected in series with said power device and with said current generator, respectively, to supply said amplifiers with respective voltages proportional to said base current and said emitter current, characterized in that the detection resistances are accomplished by means of metallic tracks of the same material.

13. Regulating circuit according to claim 11, characterized in that the two independent current generators are temperature coupled.

* * * * *